US008795462B2

(12) United States Patent
Garbar et al.

(10) Patent No.: US 8,795,462 B2
(45) Date of Patent: Aug. 5, 2014

(54) TRANSPARENT CONDUCTIVE COATING WITH FILLER MATERIAL

(75) Inventors: Arkady Garbar, Burnsville, MN (US); Fernando De La Vega, Zichron Yacov (IL); Eric L. Granstrom, Golden Valley, MN (US); Lorenzo Mangolini, Riverside, CA (US)

(73) Assignee: Cima NanoTech Israel Ltd., Caesarea (IL)

( * ) Notice: Subject to any disclaimer, the term of this patent is extended or adjusted under 35 U.S.C. 154(b) by 941 days.

(21) Appl. No.: 12/809,195

(22) PCT Filed: Dec. 19, 2008

(86) PCT No.: PCT/US2008/087771
§ 371 (c)(1),
(2), (4) Date: Jul. 26, 2011

(87) PCT Pub. No.: WO2009/086161
PCT Pub. Date: Jul. 9, 2009

(65) Prior Publication Data
US 2011/0273085 A1 Nov. 10, 2011

Related U.S. Application Data

(60) Provisional application No. 61/015,483, filed on Dec. 20, 2007.

(51) Int. Cl.
*B32B 37/12* (2006.01)
*B32B 3/10* (2006.01)
*B32B 38/10* (2006.01)
*H01J 1/62* (2006.01)
*B05D 5/12* (2006.01)
*H01B 1/02* (2006.01)
*H01B 1/12* (2006.01)
*H01B 1/04* (2006.01)

(52) U.S. Cl.
USPC ........... 156/247; 313/509; 428/206; 428/204; 427/66; 264/104; 156/60; 156/249; 252/500; 252/502; 252/514; 252/512; 977/742; 977/773; 977/762

(58) Field of Classification Search
CPC .......... B32B 37/12; B32B 3/10; B32B 38/10; B05D 5/12; H01J 1/62; H01B 1/02; H01B 1/12; H01B 1/04
USPC ............. 156/249, 60; 313/509; 428/204, 206; 427/66; 264/104; 252/500, 502, 514, 252/512; 977/742, 773, 762
See application file for complete search history.

(56) References Cited

U.S. PATENT DOCUMENTS

| 5,476,535 | A | 12/1995 | Khasin |
| 6,086,790 | A | 7/2000 | Hayashi et al. |
| 6,117,366 | A | 9/2000 | Park et al. |
| 2004/0018382 | A1 | 1/2004 | Kinlen |
| 2004/0118698 | A1 | 6/2004 | Lu et al. |
| 2004/0149962 | A1 | 8/2004 | Andriessen |
| 2005/0011550 | A1* | 1/2005 | Chittibabu et al. ........... 136/243 |
| 2005/0064618 | A1 | 3/2005 | Brown et al. |
| 2005/0214480 | A1 | 9/2005 | Garbar et al. |
| 2005/0215689 | A1* | 9/2005 | Garbar et al. ................. 524/440 |
| 2006/0062983 | A1* | 3/2006 | Irvin et al. .................... 428/220 |
| 2006/0284169 | A1 | 12/2006 | Park et al. |
| 2007/0063939 | A1 | 3/2007 | Bellamy |
| 2007/0181898 | A1 | 8/2007 | Chik et al. |
| 2007/0186971 | A1 | 8/2007 | Lochun et al. |
| 2007/0279377 | A1 | 12/2007 | Hillis et al. |
| 2011/0003141 | A1 | 1/2011 | Garbar |

FOREIGN PATENT DOCUMENTS

| JP | 10188681 A | 7/1998 |
| JP | 2002-131531 | 5/2002 |
| JP | 2006127929 A | 5/2006 |
| JP | 2007-048564 | 2/2007 |
| WO | 98/54767 | 12/1998 |
| WO | 2004/000491 | 12/2003 |
| WO | WO 03/106573 | 12/2003 |
| WO | WO 05/024853 | 3/2005 |
| WO | 2006/035735 | 4/2006 |
| WO | 2006/135735 | 12/2006 |
| WO | WO2008046058 A2 | 4/2008 |

(56) References Cited

FOREIGN PATENT DOCUMENTS

OTHER PUBLICATIONS

International Search Report and Written Opinion for PCT/US2008/087770, mailed Feb. 6, 2009, 7 pages.
International Search Report and Written Opinion for PCT/US2008/087771, mailed Feb. 25, 2009, 9 pages.
Dupont publication L-1233, 06/00, "Processing Guide for DuPont LuxPrint Electroluminescent Inks," 12 pages.
Authorized Officer Lee Young, International Preliminary Report on Patentability in PCT/US2008/087770, dated Jul. 1, 2010, 7 pages.
Authorized Officer Lee Young, International Preliminary Report on Patentability in PCT/US2008/087771, dated Jul. 1, 2010, 7 pages.
Extended European Search Report in European Application No. 08866085.7, mailed Apr. 23, 2014, 8 pages.

* cited by examiner

*Primary Examiner* — Michael Orlando
*Assistant Examiner* — Daniel Lee

(74) *Attorney, Agent, or Firm* — Fish & Richardson P.C.

(57) ABSTRACT

An article is disclosed comprising a network-like pattern of conductive traces formed of at least partially-joined nanoparticles that define randomly-shaped cells that are generally transparent to light and contain a transparent filler material. In a preferred embodiment, the filler material is conductive such as a metal oxide or a conductive polymer. In another preferred embodiment, the filler material is an adhesive that is can be used to transfer the network from one substrate to another. A preferred method of forming the article is also disclosed wherein an emulsion containing the nanoparticles in the solvent phase and the filler material in the water phase is coated onto a substrate. The emulsion is dried and the nanoparticles self-assemble to form the traces and the filler material is deposited in the cells. An electroluminescent device is also disclosed wherein the article of the invention forms a transparent electrode in the device.

7 Claims, 9 Drawing Sheets

Fig. 5    Device according to Example 1
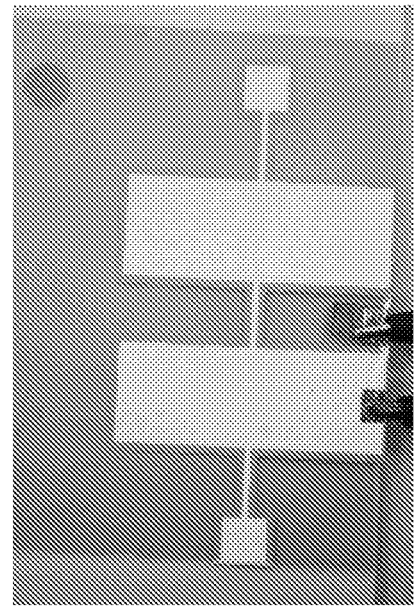
Brightness (%) = 41.3
↑ Connect to power source
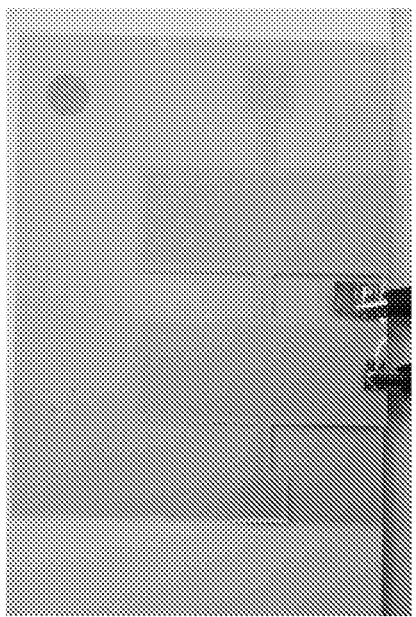

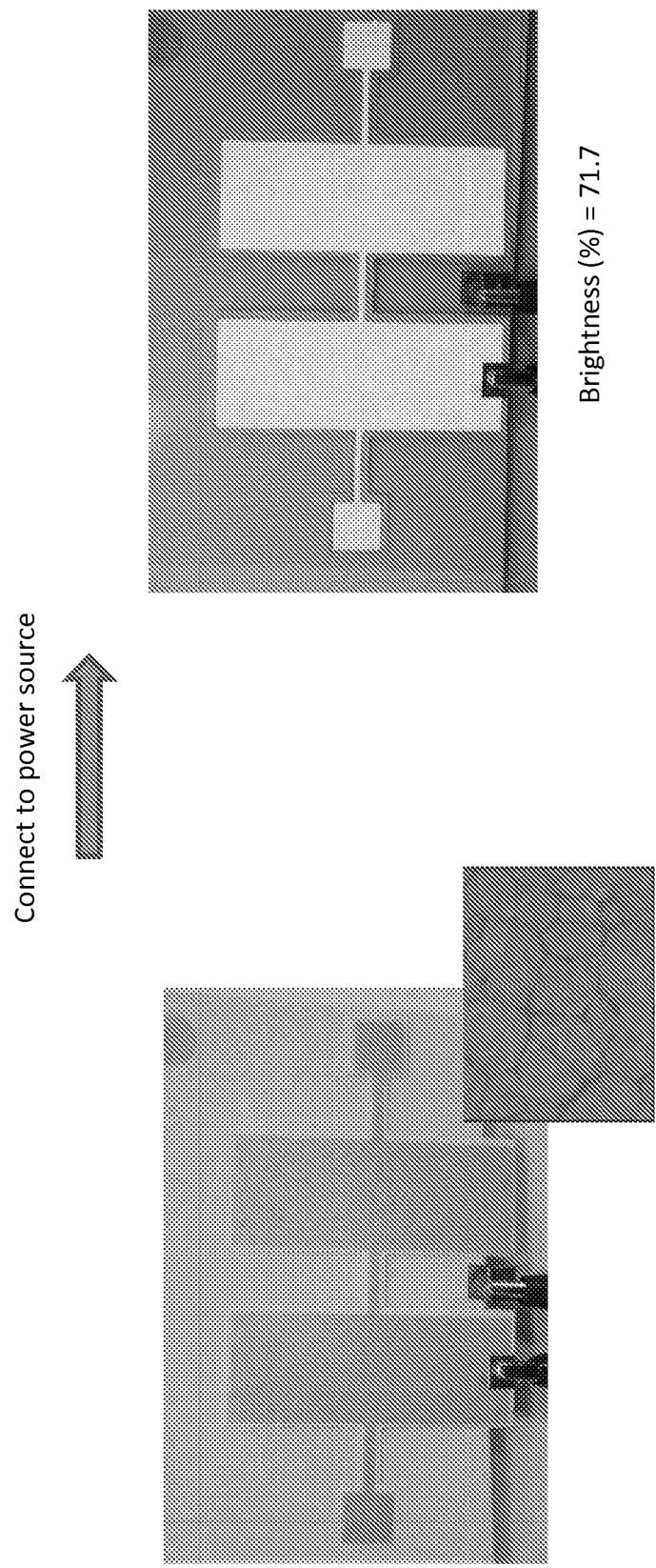
Fig. 6  Device according to Example 3

Fig. 7 Device according to Example 4
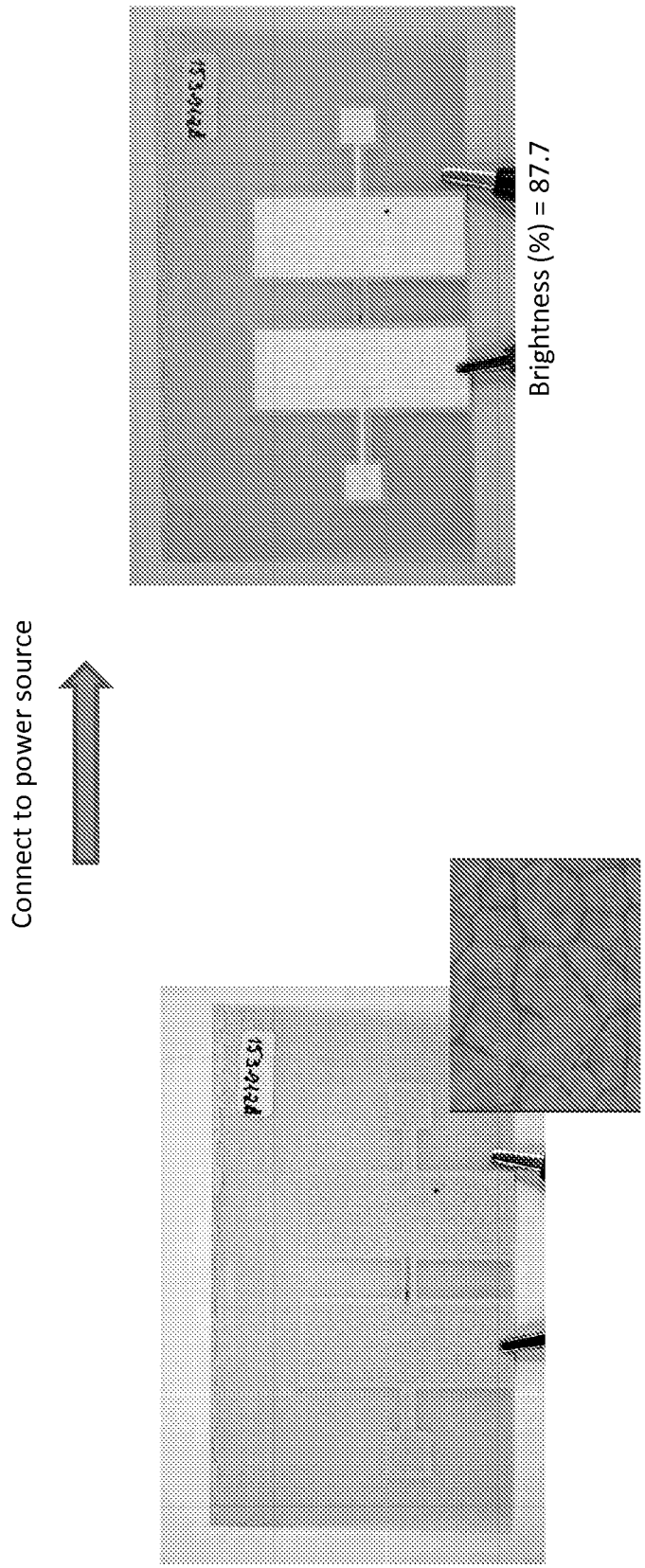

Fig. 8    Device according to Example 5
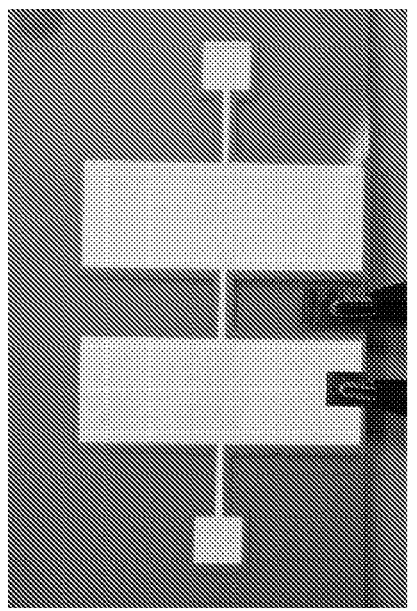
Brightness (%) = 62.6
Connect to power source
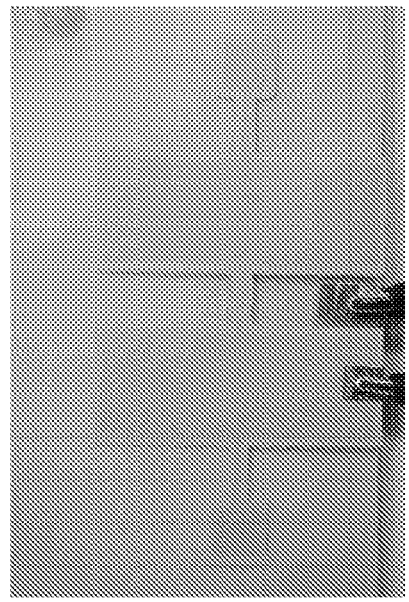

TRANSPARENT CONDUCTIVE COATING WITH FILLER MATERIAL

CROSS-REFERENCE TO RELATED APPLICATIONS

This application is a National Stage application under 35 U.S.C. 371 and claims benefit under 35 USC §119 (a) of International Application No. PCT/US2008/087771 having an International Filing Date of Dec. 19, 2008, which claims benefit of priority from to U.S. Provisional Application Ser. No. 61/015,483, filed on Dec. 20, 2007, the entire contents of which are hereby incorporated by reference.

TECHNICAL FIELD

This invention relates to transparent conductive coatings comprising a pattern of conductive traces formed of at least partially joined nanoparticles defining randomly-shaped cells transparent to light. More particularly, it relates to transparent conductive coatings formed by the self-assembly of nanoparticles from a coated emulsion into conductive traces that define randomly-shaped cells that are transparent to light. Electroluminescent devices containing such transparent conductive coating as the transparent electrode are also included within the scope of the invention. Coating compositions and processes for forming transparent conductive coatings are also described.

BACKGROUND

Transparent conductive coatings are useful in a variety of electronics devices. These coatings provide a number of functions such as electromagnetic (EMI) shielding and electrostatic dissipation, and they serve as light transmitting conductive layers and electrodes in a wide variety of applications. Such applications include, but are not limited to, touch screen displays, wireless electronic boards, photovoltaic devices, conductive textiles and fibers, organic light emitting diodes (OLEDs), electroluminescent devices, and electrophoretic displays, such as e-paper.

Transparent conductive coatings such as those described in US20050214480 and WO2006/35735 are formed from the self assembly of conductive nanoparticles coated from an emulsion onto a substrate and dried. The nanoparticles self-assemble into a network-like conductive pattern of randomly-shaped cells that are transparent to light and visible with an optical microscope. Such coatings frequently require additional properties such as conductivity within the cells of the coating, structural reinforcement, anti-reflective properties and the like to adapt the coatings for further processing or particular product applications.

SUMMARY OF THE INVENTION

The present invention provides enhanced or additional functionality to the above-described transparent coatings through the placement of certain transparent filler materials in the cells of the coating.

The present invention relates to an article comprising a network-like pattern of conductive traces formed of at least partially-joined nanoparticles defining random-shaped cells generally transparent to light wherein at least a portion of the cells are at least partially filled with a transparent filler material. The filler material can be conductive, semi-conductive or non-conductive.

Conductive filler materials will generally have a resistance in the range of $10^2$ to $10^8$ ohm/sq. Examples of conductive filler materials include metal oxides such as indium tin oxide (ITO) and antimony tin oxide (ATO) and conductive polymers such as PEDOT, PEDOT:PSS, polyaniline, polythiophenes, polyacetylene, polypyrrole, or derivatives or mixtures thereof. Conductive filler materials may also comprise a low density matrix or array of metal nanoparticles or nanowires. Conductive filler materials are useful in certain electronic devices such as electroluminescent devices, OLED displays and thin film photovoltaic devices to smooth out the conductivity of the transparent conductive coating and transport electrical charges to the center of the cells.

Semi-conductive materials such as quantum dots, silicon, germanium, compound inorganic semiconductors, or organic semiconductors are also useful filler materials in some devices such as solar cells and OLED displays. Some materials such as carbon nanotubes can be used as filler material for both conductive and semi-conductive purposes depending on the material.

Non-conductive or insulating filler materials may also be used to impart certain physical characteristics to the article or to assist in further processing and converting such as in transferring the article from one substrate to another. Examples of non-conductive materials that are useful to impart physical properties to the articles include anti-reflective materials such as glass frits, glass spheres, silicon nitride, silicon monoxide or dioxide, or titanium dioxide Other anti-reflective fillers may include low refractive index polymers and/or monomers and oligomers which can be polymerized to form low refractive index polymers. Other filler materials can be used that impart abrasion or scratch resistance, moisture resistance, oxygen resistance or UV protection. Filler materials that act as adhesives, including epoxies can be used to assist in the lamination of the article to other substrates or layers of a device.

The article typically has a substrate on at least one surface of the article. The substrate may be the substrate on which the transparent conductive coating is originally formed or a substrate to which the coating is transferred after formation. Because the article itself is flexible, it can be used to form flexible devices such flexible photovoltaic devices and flexible electroluminescent devices when supported on a flexible substrate.

In one embodiment, the filler material completely fills the cells and extends above the cells. This is useful for filler materials designed to provide barrier protection to the article against oxygen, moisture or abrasion. It is also desirable for filler materials to provide a flat or smooth surface of the article. In other applications, it is also desirable for adhesive filler materials used to transfer the article from one substrate to another or where the filler material is designed to smooth the surface of the article.

In another embodiment, the filler material fills the cells to a level less than or equal to the top of the cells. This may be useful for conductive filler materials or fillers used for their anti-reflective properties.

Another embodiment of the invention is an electroluminescent device comprising the article of the invention as the transparent electrode along with other layers typically used in electroluminescent devices including a phosphor layer, a dielectric layer, and a counter electrode, the counter electrode typically being opaque or partially opaque.

Another aspect of the invention relates to a liquid coating composition comprising an emulsion having a continuous phase comprising conductive nanoparticles and a discontinuous phase comprising a filler material, which emulsion, when coated onto a substrate, forms a transparent conductive coating comprising a network-like pattern of traces formed of at least partially-joined nanoparticles defining random-shaped cells generally transparent to light and wherein at least a portion of the cells are filled with the filler material. In a preferred embodiment, the continuous phase comprises a solvent immiscible with water and the discontinuous phase comprises water or a water-miscible solvent. Preferred nanoparticles for use in the emulsion include silver, copper, carbon, graphite or mixtures or alloys thereof. Preferred filler materials include conductive polymers such as PEDOT, PEDOT: PSS, polyaniline, polythiophenes, polyacetylene, polypyrrole, or derivatives or mixtures thereof.

Another aspect of the invention relates to a process of forming the article of the invention comprising applying the above-described liquid coating composition containing the filler material in the discontinuous phase of the emulsion to the surface of a substrate and drying the coating composition. Preferably the article is further processed by sintering to further join the nanoparticles and enhance conductivity. The article may be further processed by removing the article from the substrate and transferring it to another substrate or component of a product.

Another embodiment of the process of forming the article comprises the steps of: (a) applying a liquid emulsion comprising a continuous phase comprising conductive nanoparticles to the surface of a substrate; (b) drying the emulsion and subsequently forming a transparent conductive coating comprising a network-like pattern of traces formed of at least partially-joined nanoparticles defining random-shaped cells generally transparent to light; and (c) applying a transparent filler material to at least some of the cells of the coating. In a preferred embodiment of this process, the filler material is an adhesive that is applied to the transparent coating by wet coating. The adhesive can then be used in further processing to adhere the coating to a second substrate. This is particularly useful to allow the first substrate to be stripped away to expose an article with a smooth surface without the surface contours of the original exposed article.

Other aspects of the invention will be described in the drawings and detailed description below.

BRIEF DESCRIPTION OF THE DRAWINGS

FIG. 5 is a photograph of the electroluminescent device of Example 1.

FIG. 6 is a photograph of the electroluminescent device of Example 3.

FIG. 7 is a photograph of the electroluminescent device of Example 4.

FIG. 8 is a photograph of the electroluminescent device of Example 5.

DETAILED DESCRIPTION OF PREFERRED EMBODIMENTS

Figure 1:
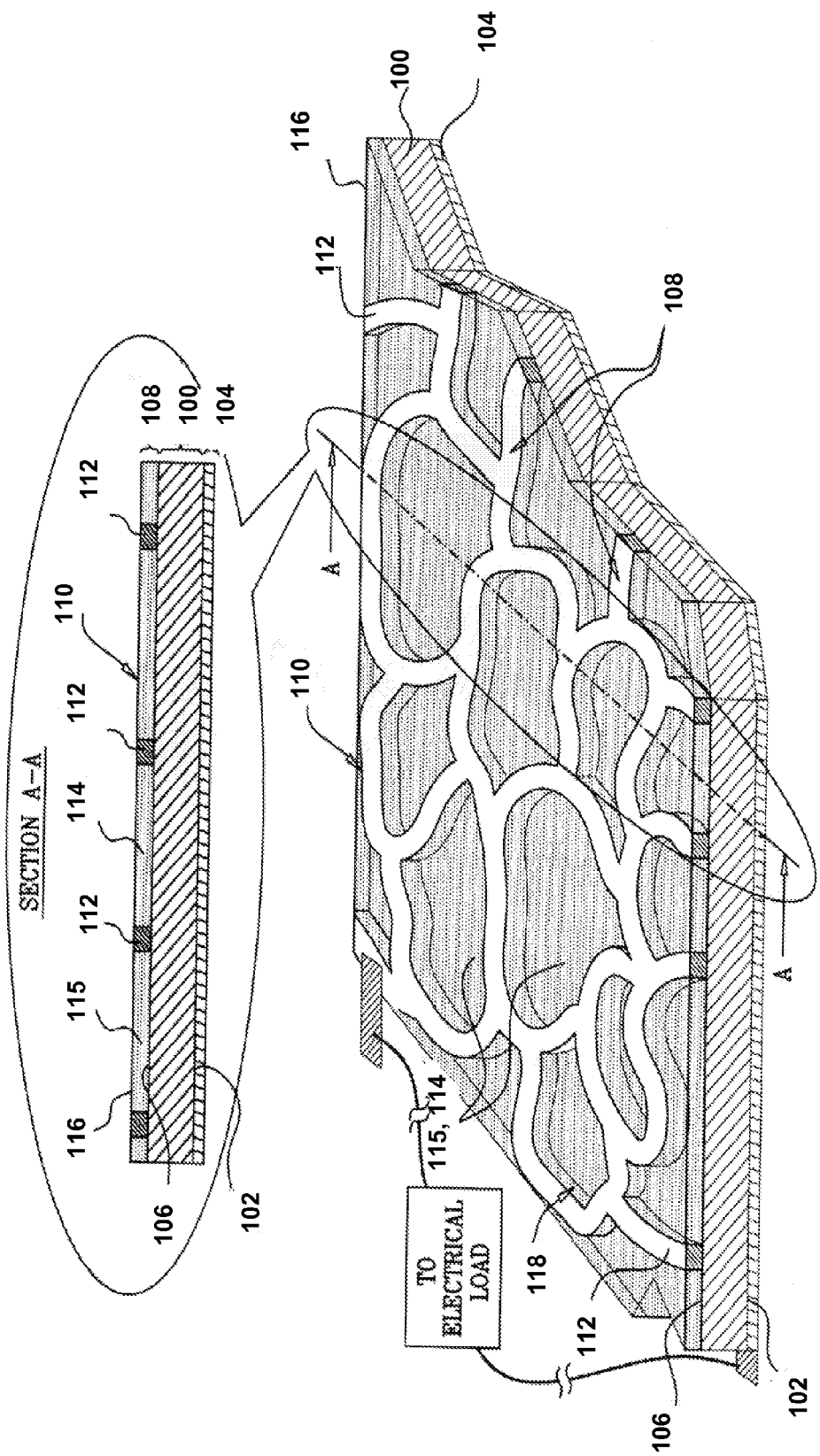
FIG. 1 illustrates the article of the invention wherein the cells of the coating are filled with a filler material.

Reference is now made to FIG. 1, which is a simplified illustration of the article of the invention formed on a substrate that adapts the article for use as the transparent front electrode in a photovoltaic device. The substrate 100 is a semiconductor layer 100 having formed on an underside surface 102 thereof an electrode 104.

Over a surface 106 of substrate 100 a transparent conductive coating ("TCC") layer 108 is formed comprising a pattern 110 of conductive traces 112 formed of collections of at least partially joined nanoparticles. Such traces define cells 114, generally free of the nanoparticles, which cells are generally transparent to light. The term "nanoparticles" as used herein refers to fine particles small enough to be dispersed in a liquid to the extent they can be coated and form a uniform coating. This generally includes particles having an average particle size less than about three micrometers. Preferably, the average particle size is less than one micrometer, and most preferably the particles are in the so-called "nano" size range of less than 0.1 micrometer in at least one dimension.

As will be described below in greater detail with reference to FIG. 3, a liquid emulsion wherein the nanoparticles are contained in the continuous phase is employed to form the TCC layer 108. In a preferred embodiment, the continuous phase evaporates faster than the discontinuous phase, allowing growth of discontinuous phase cells to occur by emulsion droplet coalescence in a controlled fashion. Drying of the emulsion produces pattern 110 comprising distinct light-transmitting cells 114 surrounded by traces 112 that transmit significantly less light than the light-transmitting cells 114. The pattern produced by the cells 114 and the peripheral traces 112 has a network-like character that is observable by a light microscope.

In a preferred embodiment, the pattern 110 is formed after deposition of a water-in-oil emulsion, where the continuous phase comprises an organic solvent having the nanoparticles dispersed therein, and the discontinuous phase comprises water or a water-miscible solvent. Materials that are soluble in the organic phase of the emulsion can be incorporated into traces 112 upon drying of the emulsion, e.g., a glass precursor to enhance contact resistance. Also, materials that have an affinity for the interface of the emulsion (the region defining the transition layer between water and oil phases of the emulsion) can be incorporated into traces 112 upon drying of the emulsion. Materials that are soluble or dispersible in the water phase of the emulsion such as certain filler materials described below will be deposited within cells 114.

The nanoparticles may be comprised of conductive metals or mixture of metals including metal alloys selected from, but not limited to, the group of silver, gold, platinum, palladium, nickel, cobalt, copper or any combination thereof. Suitable metal nanoparticles include silver, silver-copper alloys, silver palladium or other silver alloys or metals or metals alloys produced by a process known as Metallurgic Chemical Process (MCP), described in U.S. Pat. No. 5,476,535 ("Method of Producing High Purity Ultra-Fine Metal Powder") and PCT application WO 2004/000491 A2 ("A Method for the Production of Highly Pure Metallic Nano-Powders and Nano-Powders Produced Thereby"). The nanoparticles may be coated or non-coated and may be agglomerated or non-agglomerated.

The conductive nanoparticles may also be comprised of metal oxides, metal salts, conductive polymers, carbon derivatives such as carbon black, graphite, fullerenes, or other carbon allotropes. Precursors or combinations of the above particles may also be employed.

The conductive nanoparticles mostly, though not necessarily exclusively, become part of the traces 112 of the conductive network. In addition to the conductive particles mentioned above, the traces 112 may also include other additional conductive materials such as metal oxides (for example ATO or ITO) or conductive polymers, or combinations thereof. These additional conductive materials may be supplied in various forms, for example, but not limited to particles, solution or gelled particles.

Emulsions of the type described hereinabove and use thereof to produce conductive traces 112 are described in applicant/assignee's patent publications US20050215689 and WO2006135735, the disclosures of which are hereby incorporated by reference. Typically, the width of the traces 112 is less than 40 microns, the height is less than 20 microns and average cell diameter is less than 1000 microns, and in some cases much smaller, for example on the order of 5 microns. Generally, the percentage of the overall surface 106 of the substrate 100 that does not receive incoming light due to shading by traces 112 is, for many applications, preferably not higher than 15%, though in other applications may be as high as 50% or more. Furthermore, the traces 112 may provide texture and anti-reflective characteristics.

Figure 2:
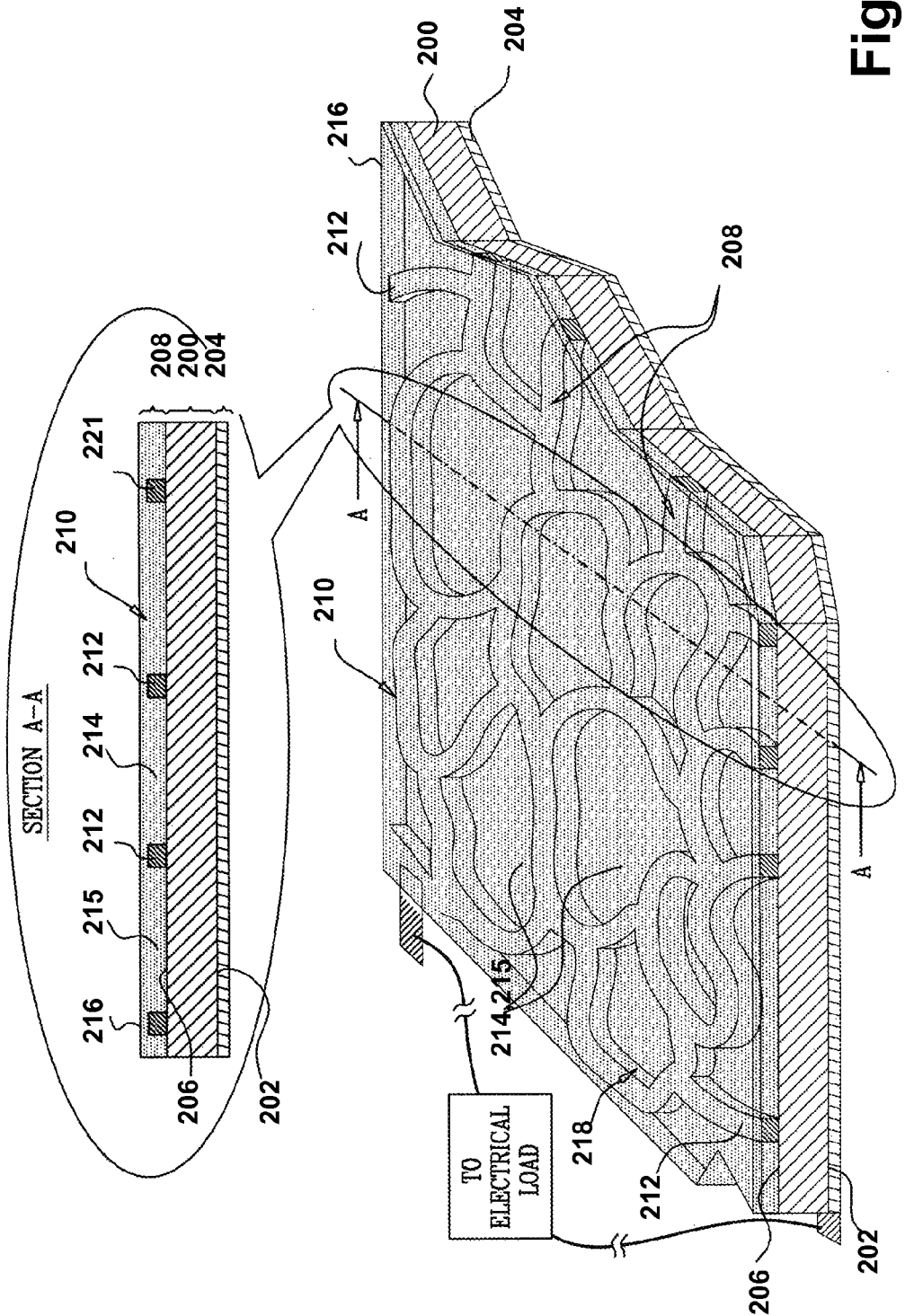
FIG. 2 illustrates the article wherein the filler material in the cells extends over the traces of the coating.

Cells 14 of TCC layer 108 are filled with a light transmissive filler material 115. Filler material 115 can fill the cells to a level less than or equal to the top of the traces 112 forming the cells as illustrated in FIG. 1 or it can completely fill the cells and extend above the cells as illustrated in FIG. 2. The choice depends on the filler material selected, the desired functionality of the filler material, and the method of forming the filler material in the cells.

Filler material 115 may be conductive thereby providing greater homogeneity or uniformity to the conductivity of the overall coating and allowing more facile transport of electrical charge to the center of the cells. Conductive fillers will generally have a resistance in the range of $10^2$ to $10^8$ ohm/sq. Suitable conductive filler materials are typically materials that form a continuous film such as a transparent metal oxide, e.g., indium tin oxide or antimony tin oxide or a conductive polymer or combinations thereof. The conductive filler material may also include other conductive species such as, but not limited to, carbon nanotubes. Alternatively, small amounts of conductive nanoparticles or nanorods may be used, such as silver nanoparticles or silver nanowires. In one preferred embodiment, the conductive filler material is a conductive polymer such as PEDOT, PEDOT:PSS, polyaniline, polythiophenes, polyacetylene, polypyrrole, and derivatives and mixtures thereof.

It has been found that, if present by itself as a layer, a conductive filler material such as PEDOT:PSS or suitable conductive oxide gives a relatively high surface resistance of greater than about $10^2$ ohm/sq when deposited on a substrate. By placing conductive polymer within the cells 114, the sheet resistance of the combined film is significantly less than if only transparent conductive polymer is used to form the transparent conductive layer. As illustrated below in the case of electroluminescent devices, by including a filler material such as ATO in the cells of the TCC, the overall brightness of the device is dramatically increased over the device without the filler material.

Filler 115 may also be used to provide other functionality instead of, or in addition to, conductivity, such as mechanical protection, especially anti-abrasion or anti-scratch protection, as well as protection against moisture, oxygen, ultraviolet radiation or other environmental challenges. Filler materials may also be used to provide anti-reflective properties, examples of which include glass frits, glass spheres, silicon nitride, silicon monoxide or dioxide, titanium dioxide or zinc oxide. As an example, antireflection coatings of $TiO_2$ may be deposited in a layer several hundred nanometers thick using simple techniques like spraying or chemical vapor deposition, or by adding water soluble $TiO2$ nanoparticles, or nanorods, or nanowires to the water phase of the emulsion. Another method to form such anti-reflective coating is to add to the water phase of the emulsion precursors such as zinc acetate, zinc nitrate, titanium isopropoxide, so that the antireflective layer is directly formed after heat treatment. Filler materials providing these functionalities need not be, and generally are not, conductive.

Filler material 115 may also be a semiconductive material such as silicon, germanium, compound inorganic semiconductors, organic semiconductors or quantum dots. These filler materials provide use in some devices such as solar cells.

Filler material 115 may also be a high dielectric constant material, such as are used in conventional dielectric applications. These material provide greater uniformity in applied fields/currents throughout the cell and network structure.

Both conductive and non-conductive filler material can be used to create a smooth overall surface 116 at the height of the traces 112. For example, conductive or non-conductive transparent material, such as a conductive polymer, may be applied to fill in and smooth cells 114 and to help conduct charges within and to/from the device. In a preferred embodiment, the roughness of the TCC layer is ≤5 microns, preferably <2.5 microns, more preferably <0.5 micron, and most preferably <0.15 microns (150 nanometers). The smoothness of the TCC layer may be important in the manufacture of certain devices such as high quality OLED displays.

Filler 115 may also be a "glue" or a pressure sensitive adhesive (PSA) or heat sensitive adhesive that will adhere or laminate an additional layer (polymer, substrate, etc.) on top of the TCC layer. This can allow for removal of the original substrate on which the TCC is formed thereby exposing the smooth side of the TCC layer that may be desirable in subsequent device construction or in facilitating transfer to a more desirable substrate for a particular product application. Epoxy adhesives or UV curable acrylic adhesives are examples of adhesive filler materials.

Filler 115 can also be a "hard coating" or "anti glare" coating or other coating similar to those used in display films. It can also be a polarizer. It can be also an antistatic material or anti-smudge material. Also materials that selectively absorb and emit light or combinations of the foregoing can be used.

The article of FIG. 1 may stand alone or may be formed on or placed on a flexible or rigid substrate The substrate may be rigid or flexible, and may be constructed from materials such as, but not limited to, polymeric, paper, ceramic, glass, silicon, oxides, semiconductor, or laminate materials. A preferred substrate for many product applications is a polyester film, especially a polyester film based on polyethylene terephthalate (PET).

The pattern 110 formed by conductive traces 112 generally has a sheet resistance after sintering between 0.005 ohm/sq to 20 ohm/sq, preferably less than 50 ohm/sq, more preferably less than 20 ohm/sq, and most preferably less than or equal to 10 ohm/sq. Sheet resistance may be reduced by subsequent electroplating of the pattern.

TCC layer 108 is particularly useful in devices that require transmission of visible, NIR, IR and/or UV regions of the electromagnetic spectrum. The term "light transmitting" is used herein interchangeably with the term "transparent" and refers to light transmission of at least 30%, and preferably at least 50%, and more preferably at least 70%. For applications requiring transmission of visible light, transmission is measured in the wavelength range of 400 nm to 700 nm, and more specifically can be measured at 550 nm.

Reference is now made to FIG. 2, which is a simplified illustration of another article according to the invention similar to the article illustrated in FIG. 1 except that filler material 215 extends over the top of traces 212. Filler material 215 smooths out the roughness of the traces and as noted above can be an adhesive material that will adhere the traces 212 to another substrate of layer of a device.

As is the case with the device of FIG. 1, the device shown in FIG. 2 may stand alone or may be formed on or placed on a flexible or rigid substrate. The device may be formed with a flat surface or a curved surface. The substrate can have a rough surface and/or a non-flat surface.

Figure 3:
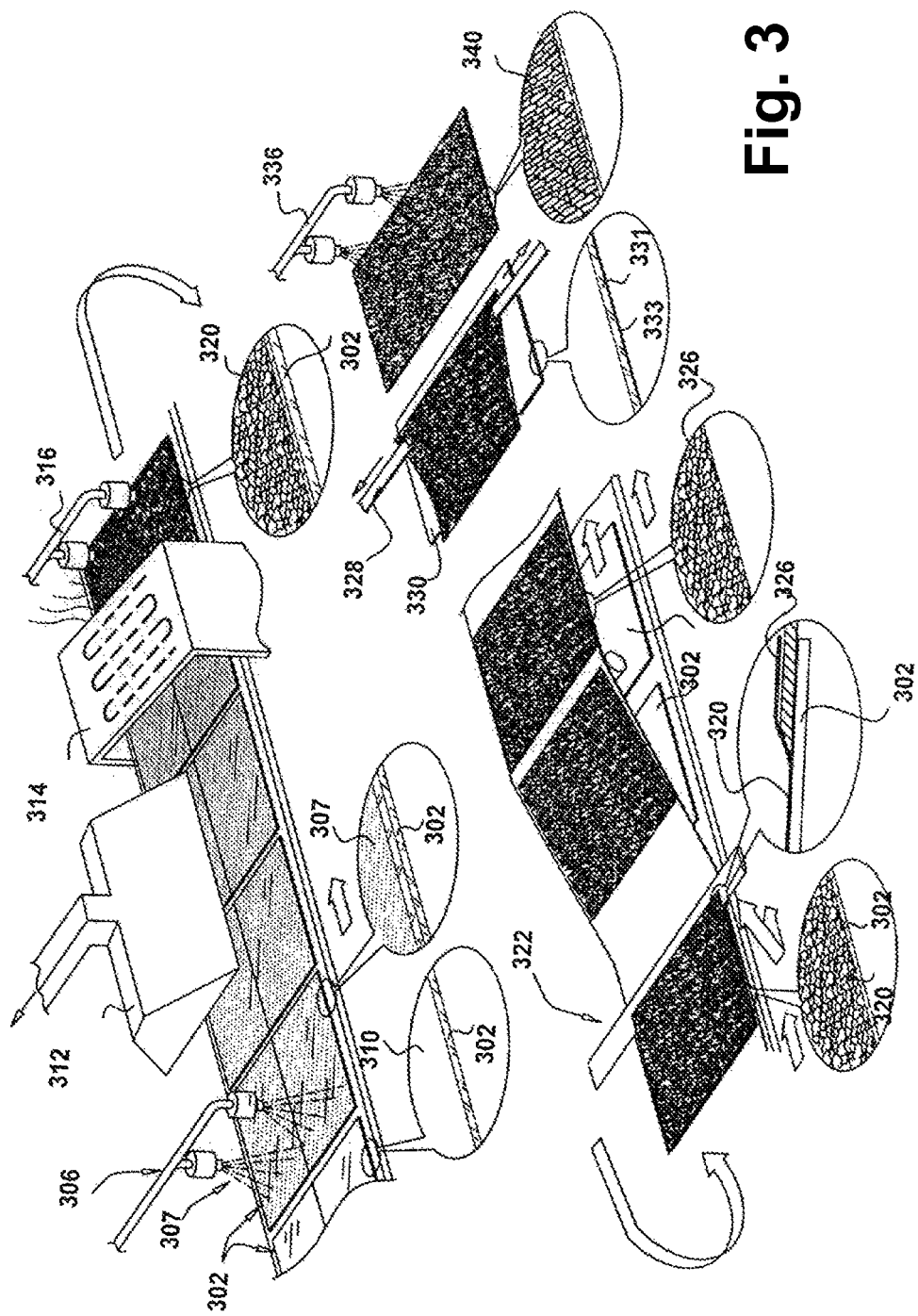
FIG. 3 is an illustrative diagram of a process for manufacturing the article of the invention in the form of a simple photovoltaic cell.

Reference is now made to FIG. 3 which is a simplified diagram of a process for manufacturing articles such as those shown in FIGS. 1 and 2. As seen in FIG. 3, a substrate assembly or plurality of substrate assemblies 302 are provided.

Substrate assembly 302 may be flexible or rigid such as glass, paper, ceramic and fabric. Such substrate may include a polymer such as a polyester, polyamide, polyimide, polycarbonate, polyolefin, polyacrylate, polymethyl methacrylate (PMMA), a copolymer, or mixtures thereof. The substrate 302 may have a flat surface or a curved surface, and the surface may be smooth or rough.

In order to improve certain properties, the substrate may be pre-treated and/or may have a preliminary coating layer applied prior to the coating of the TCC formulation. For example, the substrate may have a primer layer to improve TCC coating adhesion, or the substrate may have a hard-coat layer applied in order to provide mechanical resistance to scratching and damage.

Pretreatment may be performed, for example to clean the surface or alter it by physical means or chemical means. Such means include, but are not limited to, corona, plasma, UV-exposure, laser, glow discharge, microwave, flame treatment, chemical etching, mechanical etching, or printing. Such treatments can be applied to neat substrates or to substrates for which the film supplier has already placed a primer, preliminary coating, or otherwise pretreated the surface of the substrate.

Pretreatment steps can be performed off-line or on-line immediately prior to subsequent coating, printing, and deposition steps. Such physical treatment of the substrate can be performed by batch process equipment or continuous coating equipment, on small laboratory scales or on larger industrial scales, including roll-to-roll processes.

Substrate assembly 302 is supplied to an emulsion coating station 306. At emulsion coating station 306, an emulsion 307 is applied to a surface 310 of the substrate assembly 302.

Emulsion 307 is preferably a water-in-oil emulsion as described above having the conductive nanoparticles dispersed in the organic phase of the emulsion and a filler material such PEDOT:PSS in the water phase. Mixing of the particles with the desired solvent to form, the dispersion can be accomplished by mechanical stirring, ball mill mixing, and by means of homogenizers or ultrasonic mixing The emulsion 307 can be applied at emulsion coating station 306 by any suitable technique such as die-coating, bar-coating, screen-printing, ink jet printing, spin-coating, dip-coating, spray-coating, gravure printing, roll-coating, and blade coating. Laboratory-scale or industrial processes can be employed at emulsion coating station 906, utilizing single or multiple pass coating equipment. The emulsion 307 should be applied to the surface 310 of substrate assembly 302 to provide a wet emulsion thickness of 1 to 200 microns and more preferably 5 to 200 microns.

It is a particular feature of the present invention that the step of applying an emulsion to a surface can be performed without direct contact of the surface by the coating instrument. For example, coating using a knife gap-coater, an air knife coater, a comma coater, a slot die or a curtain coater does not require direct contact with the substrate surface 310 by the coating instrument. This is in contrast to screen-printing, gravure printing, and bar-coating, which typically involve direct contact with the substrate. When non-contact printing techniques are employed, delicate or sensitive features that are present on the substrate surface 310 are less prone to damage or deformation.

After applying the emulsion 307 to surface 310; the solvent is evaporated from the emulsion 307, with or without the application of temperatures above ambient, as indicated at reference numeral 312. Preferably, the remaining coating is sintered at a temperature within the range of about room temperature to about 850° C. as indicated at reference numeral 314, thereby providing a TCC layer 320 over the surface 310. Sintering preferably takes place at ambient atmospheric pressure.

Alternatively or additionally, all or part of the sintering process indicated at reference numeral 314 can take place in the presence of a chemical that induces the sintering process. Examples of suitable chemicals include formaldehyde or acids, such as formic acid, acetic acid, and hydrochloric acid. The chemical may be in the form of a vapor or a liquid to which the deposited particles are exposed. Alternatively, such chemicals may be incorporated into the composition comprising the nanoparticles prior to deposition, or may be deposited on the nanoparticles after depositing the particles on the substrate.

The process may also include a post-sintering treatment step, as indicated at reference numeral 316, in which the electrode layer 920 may be further sintered, annealed, or otherwise post-treated using thermal, laser, UV, acid or other treatments and/or exposure to chemicals such as metal salts, bases, or ionic liquids. The treated TCC layer 320 may be washed with water or other chemical wash solutions such as acid solution, acetone, or other suitable liquids. Post-treatment of the coating can be performed by batch process equipment or continuous coating equipment, on small laboratory scales or on larger industrial scales, including roll-to-roll processes.

TCC layer 320 is characterized by sheet resistances after sintering between 0.005 Ω/square to 5 kΩ/square, preferably less than 50 ohm/sq, more preferably less than 20 ohm/sq, and most preferably less than or equal to 10 ohm/sq. Sheet resistance may be further reduced using techniques such as electroplating of TCC layer 320.

It is also a particular feature of the process that formation of the TCC layer 320 may employ low temperature deposition and treatment methodologies at temperatures of up to about 350° C. Low temperature liquid phase processing may be carried out at relatively low cost, especially when TCC layers 320 are being formed on large scale surfaces and allow the use of heat sensitive substrates such as certain polymeric substrates.

It is also a particular feature of the process that formation of TCC layer 320 may be controlled in order to get different cell sizes and adjust them to obtain optimum performance for a particular device. An illustration of the use of a primer on the substrate prior to forming the TCC to control cell size is shown in examples 1-5 below.

An alternative to applying the filler material in the emulsion formulation in a singe step process as illustrated in FIG. 3, the filler material can be applied by conventional methods after formation of the coating such as deposition from solution, coating by any of the methods described above, and direct printing, e.g. ink jet or roll-to-roll printing. Other deposition and feature-forming methods, for example vapor deposition, lithography, optical lithography, etching, solubilization, vacuum sublimation, metal deposition by vacuum evaporation, sputtering, ion bombardment, electroplating, electroless plating, laser patterning, laser ablation or combinations of the foregoing can be used depending on the filler material being applied.

At TCC removal station 322, TCC layer 320 is separated from substrate assembly 302, forming a separated or free-standing TCC layer 326. Separation of TCC layer 320 from substrate assembly 302 may be accomplished by physical methods such as scraping, peeling, knife separating, or floating, or by chemical methods, such as dissolution or heating of a release agent. The presence of a release agent or release layer or the absence of an adhesion agent can also be used to allow for removal of electrode layer 320.

The process may also include a deformation step as indicated at reference numeral 328, in which the TCC layer 326 is elongated or deformed so as to change the shape of the light transmitting areas within the pattern of conductive traces. For example, elongation can orient and increase the aspect ratio of the cells in the pattern as illustrated by pattern 340.

The separated TCC layer 326 with pattern 320 or 340 may be transferred to a another substrate 330 such as a semiconductor assembly for subsequent use as a photovoltaic device. The semiconductor substrate assembly 330 includes a semiconductor substrate 331, similar to semiconductor substrates 100 and 200 shown in FIGS. 1 and 2 having formed thereon a TCC layer 333. Additional treatment steps can be carried out as illustrated at reference numeral 336 as described above in connection with reference numeral 316.

The remaining description as well as examples 1-5 will further describe and illustrate the article of the invention used as a transparent electrode in an electroluminescent device.

Electroluminescent devices employ a power source, usually by AC voltage, to generate a changing electric field within a phosphor layer, which causes the phosphor to emit light. Phosphors are typically powders that phosphoresce at characteristic wave lengths and thereby emit light of particular colors. Particle size of the phosphor is typically selected to provide high efficiency of light emission. (*Reference: DuPont publication L-1233, 06/00, "Processing Guide for DuPont LuxPrint Electroluminescent Inks"*)

The article of the invention may be used in a variety of electroluminescent devices and applications including, but not limited to, light emitting diodes (including OLEDs and poly-LEDs), e-paper, outdoor lighting, and internal vehicle lighting. Such devices may be flexible or rigid.

Electroluminescent devices include a number of layers, for example, such a device may include, but is not limited to, the following layers: a substrate, a transparent conductive electrode layer, a phosphor layer, a dielectric layer (or "insulating" layer), and a counter electrode that is typically, though not necessarily, at least partially opaque. Alternatively, the device may be assembled so that the substrate is adjacent to the counter electrode.

Figure 4:
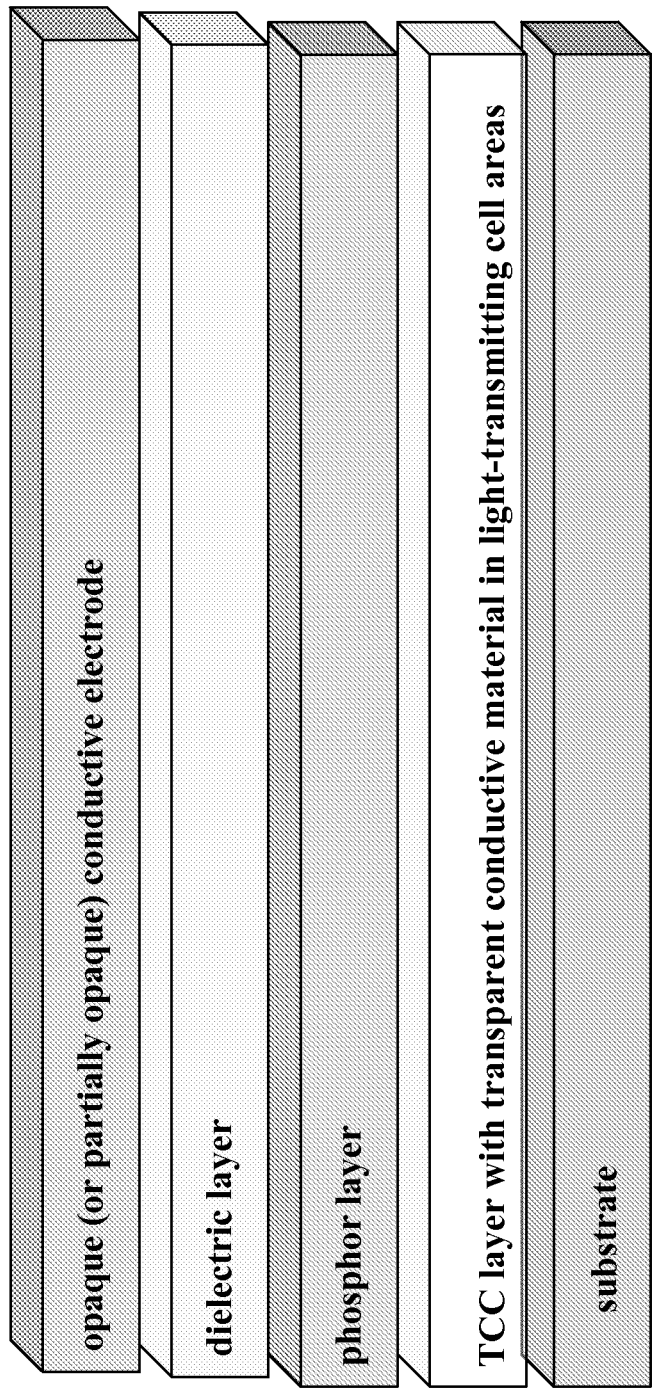
FIG. 4 illustrates a simple electroluminescent device with the article of the invention forming a transparent electrode.

An embodiment of a structure suitable as part of an electroluminescent device and which includes a transparent conductive coating of the type described herein as the light transmitting conductive electrode is shown in FIG. 4. In FIG. 4, a TCC layer is placed onto a substrate, then a phosphor layer is placed on top of the TCC layer, followed by a dielectric layer on the phosphor layer, and then a counter electrode is placed on top of the dielectric layer. An encapsulating protective layer may also be placed on the counter layer. A dielectric layer between the TCC layer and the phosphor layer may also be included in such a structure. Typical functions of the dielectric layer include evening out the electric field, preventing the device from shorting, preventing diffusion of species into the phosphor layer, transmitting the applied field more efficiently, and reflecting light.

The preferred filler materials for use in the electroluminescent device are transparent conductive materials. Especially preferred are transparent metal oxides such as indium tin oxide and antimony tin oxide and conductive polymers such as PEDOT, PEDOT/PSS polyaniline, polythiophenes, polyacetylene, polypyrrole, and mixtures and derivatives thereof. These filler materials may be provided in various forms, for example, but not limited to, particles, solution or gelled particles. They may be applied by any of various known methods such as, but not limited to, sputtering or deposition from a solution. The most preferred method of applying the filler material, especially in the case of conductive polymers, is to include the material in the water phase of the emulsion and coat the TCC layer and the filler in a single step process. Alternatively, precursors of the polymers such as monomers, oligomers, and polymer blocks may be incorporated into the formulation and then polymerized in-situ after coating in a subsequent step.

An additional dielectric layer may be present between the transparent conductive electrode layer and the phosphor layer. Optionally, an additional transparent conductive layer may also be deposited or present on top of the first transparent conductive electrode layer. Such a layer may further provide a smoothing function of the layer beneath it. Additional layers that function to provide mechanical or environmental protection may also be present in the device, especially on the outermost layers of the device, for example a layer that comprises an encapsulating material on a side of the device that is opposite the substrate.

For electroluminescent devices, sheet resistance for the transparent conductive electrode layer is typically less than 400 ohm/sq, preferably less than 250 ohm/sq and more preferably less than 100 ohm/sq. Light transmission ("transparency") of this layer is typically >75%. With the technology described here using transparent conductive electrodes with network-like patterns having light transmitting cell areas separated by conductive pattern lines, sheet resistance is typically <50 ohm/sq, preferably <10 ohm/sq, and even values for layer sheet resistance of ≤5 ohm/sq are also routinely achieved. The need for printing silver bus bars on a transparent electrode may thereby be eliminated. These sheet resistance values may be compared to those of ITO which are typically greater than 60 ohm/sq.

In a preferred embodiment, the average size of the light-transmitting cell in the network-like pattern of the TCC electrode are on the order of the size of the phosphor particles in the phosphor layer, that is, the cell size is preferably less than or equal to about 3 times the average size of the phosphor particles, and more preferably less than or equal to 2 times the size of the phosphor particles. This size ratio is advantageous for allowing the phosphor particles to be excited by the electric field produced between the electrodes. The effect of cell size is likely to be less pronounced where the TCC cells are filled with transparent conductive filler material.

An electroluminescent device made in accordance with the present invention further includes a dielectric layer. This layer may be formed from commercial screen-printed thick-film pastes, such as Dupont's Luxprint 8153. Suitable dielectrics may include, but are not limited to, barium titanate, lead zirconate titante, or lead niobate.

The phosphor layer of an EL device includes phosphor particles, which are luminescent when provided with high strength, alternating electrical field, and provide white, green-blue, yellow-green or other colors. Such particles are supplied by suppliers and manufacturers such as, but not limited to, DuPont, Acheson, Toshiba, or Sylvania. They may be made from a host of materials such as oxides, sulfides, selenides, halides, or silicates of zinc, cadmium, manganese, aluminum, silicon, or various rare earth metals or transition metal compounds or combinations thereof. The materials may include, but are not limited to, metal oxides, metal halides, metal chalcoginides, or combinations thereof such as metal oxohalides, metal silicates, metal borates, metal phosphates, metal aluminates, and metal sulfides. Activators may be selected from the same list and added to a host material to prolong emission time. Alternatively, quench materials such as nickel can be used to quench the afterglow and shorten decay time. Specific examples of phosphor materials include, but are not limited to, zinc sulfide, zinc sulfide silver, cadmium sulfide, yttrium oxide-sulfide activated with europium, strontium aluminate. Phosphor particles may be encapsulated to protect from environmental factors such as moisture, or they may be unencapsulated. Phosphor particles typically have an average nominal size of about 0.05 microns to about 50 microns, and preferably have an average nominal size of about 10 microns to about 40 microns. Other light emitting materials such as light emitting polymers may also be used instead of or in combination with the phosphor particle types mentioned above. Phosphor particles and light-emitting materials, including thin film light-emitting materials and light-emitting polymers, as mentioned in U.S. Pat. No. 7,361,413 which is hereby incorporated by reference, may also be used in the phosphor layer of the present invention.

In general, the electric field is proportional to the applied voltage and inversely proportional to electrode separation distance. Thus brightness can be increased by raising the voltage or by minimizing total thickness of layers between the electrodes.

The second electrode of an EL device is typically opaque or partially opaque. It may be fully covering or partially covering of the layer area. The second electrode may be formed by deposition of conductive ink by any known method, such as, but not limited to, ink jet printing, screen-printing, sputtering, or coating. The ink may include conductive carbon or silver, or a combination of them. Screen-printed silver bus bars are known in the art, typically in conjunction with carbon coatings for the second electrode. In a preferred embodiment, the conductive ink includes nanosilver particles, for example Cima Nanotech's commercially available IJ242-54 ink.

An encapsulating layer may be provided in an EL device to prevent moisture or gas ingress, or for safety or insulation purposes. An encapsulating layer on the transparent side of a flexible device may be provided by materials such as, but not limited to, barrier films or polymeric materials. These materials as well as glass and other rigid transparent barrier materials may be used for providing barrier for non-flexible devices. For the non-transparent side of the device, the material may be any suitable barrier material. Encapsulating layers may include UV-curable components such as UV-activated oligomers, monomers, and photoinitiators.

In addition, a power source is required for an electroluminescent device. The power source may be direct current (DC) or alternating current (AC). Preferably the power source is AC within a range of 30-200V, 50-1000 Hz, for example an AC voltage source at 80-120V AC and 400 Hz, or a standard 110V 60 Hz power source.

The composite device for any of the devices described herein may be flexible or rigid and may be characterized in terms of measurable properties such as, but not limited to, illuminated area (e.g. dimensions, shape, percent coverage), luminance (or "luminosity" or "brightness", typically measured in foot Lambert fL or candela per square meter $cd/m^2$), illuminance, brightness as a function of time, current, capacitance, power consumption, efficacy (e.g. expressed in lumens/watt), layer adhesion, power consumption, heat generation, vibration and impact resistance. Brightness properties are typically measured relative to a control, for example an ITO control.

A particular feature of the present invention is that relatively large EL devices with areas $>60$ cm$^2$, and even $>1$ m$^2$, and $>2$ m$^2$ may be produced, particularly owing to the low sheet resistance of the described electrode material. Furthermore, with the transparent conductive electrodes of the present invention, approximately the same brightness over the width and length of devices of this size can be achieved without the need for distinct bus bars.

Deposition of the transparent conductive coating for the purpose of providing an electrode of an electroluminescent device includes the steps of selecting the components of the formulation, mixing the selected dispersion components, making an emulsion from the dispersion, coating the resulting formulation on a selected substrate to a selected wet thickness, and then drying the coating to remove solvent.

Mixing of the components may be accomplished by any known methods, such as, but not limited to, mechanical stirring, ball mill mixing, homogenizers or ultrasonic mixing equipment. Mixing order, times, and temperature can be optimized for each formulation.

The TCC formulation may be tested and characterized for various properties during and after preparation, during storage, prior to coating, and during coating. Such tests may include, but are not limited to, particle size distribution, viscosity, metal-loading, surface tension, stability, and settling. The process may further include storing the coating intermediates or the final formulation until use, and heating and/or mixing prior to deposition. The average particle size of the dispersion and emulsion is preferably stable for the duration of storage prior to use.

The emulsion may be coated directly onto the selected substrate by means of batch coating or continuous coating equipment and processes. The substrate to be coated may be pretreated, as discussed previously.

The coating and device assembly stages of the present invention may be performed in batch or continuous processes, on small laboratory scale or on larger industrial scales, including roll-to-roll processes. Deposition of the coating may be performed by any of a variety of printing or coating techniques known in the art, including, but not limited to, ink-jet printing, screen-printing, and bar spreading. Deposition by coating can be accomplished via contact or non-contact coating, such as with hand coaters, dip-coaters, spin-coaters, spray-coaters, bar coaters, comma coaters, die coaters, slot die coaters, gravure coaters, roll coaters, reverse roll coaters, knife coaters, blade coaters, rod coaters, extrusion coaters, curtain coaters, or any other known coating or metering device. Coating may involve single pass or multiple pass processes. Wet coating thickness is preferably less than 100 microns, more preferably less than 60 microns.

In one embodiment of the invention, the coating process involves the deposition of a single layer electrode that contains transparent conductive material such as conductive polymer or metal oxide in the light-transmitting cell areas. In a preferred embodiment, the materials for the coating are all deposited in a one-step one-pot process to provide a transparent conductive layer that includes transparent conductive material in the light-transmitting cell areas.

After coating of the substrate or underlying layer with the TCC coating formulation, the solvent is removed by evaporation, for example by drying at room conditions or by thermal treatment. If UV-curing components are utilized in the formulation, the coated formulation is then exposed to a UV-lamp for polymerization, curing, and/or fixation.

Post-coating treatment steps for curing, sintering, patterning, adhesion, or other property improvement can then be further applied, for example by thermal, laser, microwave, ultraviolet, or chemical exposure steps, or combinations thereof. Post-coating washing steps may also be applied, for example, washing with water and/or other chemical wash solutions such as, but not limited to, acid solution, acetone, or other organic solvent wash steps. Sheet resistance may also be reduced using techniques such as electroplating of the TCC layer.

Post-treatment of the coating can be performed by batch process equipment or continuous coating equipment, on small laboratory scales or on larger industrial scales, including roll-to-roll processes.

Following deposition of the TCC formulation on the substrate or on another appropriate layer of the intended EL device, the resulting transparent electrode layer may be characterized in terms of various measurable properties, including, but not limited to dry film thickness, homogeneity on the surface, electrical sheet resistance, volume resistivity, surface energy, adhesion, average cell size, cell size distribution, line height, line thickness, light transmittance, haze, weatherability, stretching, flexibility, ability to withstand torsion, bending, fatigue, and resistance to scratching, rubbing, rolling, pressing or other mechanical action.

Additional layers or features of the device, including layers such as the phosphor layer, the dielectric layer, or the counter electrode, may be deposited by a variety of techniques. These techniques include, but are not limited to, printing or coating by any of the methods described above, or sputtering, deposition from solution, vapor deposition, lithography, etching, solubilization, vacuum sublimation, deposition by vacuum evaporation, ion bombardment, electroplating, electroless plating, laser patterning, laser ablation, or combinations of the foregoing. These processes may involve single or multiple passes of a given material. The additional layers or features may be applied by batch process equipment or continuous coating equipment, on small laboratory scales or on larger industrial scales, including roll-to-roll processes. In general, defects such as pin-holes are to be avoided when layers are applied.

EXAMPLES

The invention is further illustrated by the following non-limiting examples. The brightness values reported for the electroluminescent devices of examples 1-5 are given in percentages relative to an 80 ohm/sq ITO control sample (ITO on PET, Cat. # TMOx-80-ST504-7, SKC, Korea)

Comparative Example 1

EL Device without Filler Material (41 Microns Cell Size)

A transparent conductive coating layer having the following formulation:

| Material | weight percent |
| --- | --- |
| Byk 410 | 0.24 |
| Span 60 | 0.14 |
| Aniline | 0.08 |
| Cymel 303 | 0.07 |
| K-flex XM 307 | 0.21 |
| Nacure 2501 | 0.25 |
| Cyclohexanone | 4.32 |
| Toluene | 63.00 |
| P204 | 3.43 |
| Water phase (0.02% Byk-348 in water) | 28.27 |
| total | 100% | was prepared according to methods described in US2005/0215689. The substrate was an optical grade PET substrate (Skyrol SH34, SKC, Korea). A flexible EL device was assembled such that on top of the TCC coating side of the film, a phosphor layer (E80-01 EL paste, Mobichem, Israel) was placed, followed by a dielectric layer (D80-01 Dielectric paste, Mobichem, Israel) and a counter electrode (EL16, Acheson). The resulting EL device is represented schematically in FIG. 4 except the TCC layer did not include a filler material.

When connected to a 100V AC 400 Hz power source, the device was illuminated as shown in FIG. 5. TCC coated film properties and selected properties of the resulting EL device are given in Table 1 below. Average cell size of the TCC electrode layer was 41 μm and brightness of the device relative to the ITO control was 41.3%

Comparative Example 2

EL Device without Filler Material (202 Microns Cell Size)

A transparent conductive coating layer having the following formulation:

| Material | weight percent |
| --- | --- |
| Byk 410 | 0.28 |
| Span 60 | 0.16 |
| Aniline | 0.09 |
| Cymel 303 | 0.08 |
| K-flex XM 307 | 0.24 |
| Nacure 2501 | 0.29 |
| Cyclohexanone | 5.04 |
| Toluene | 56.84 |
| P204 | 4.00 |
| Water phase (0.02% Byk-348 in water) | 32.98 |
| total | 100% | was prepared according to methods described in US2005/0215689. The substrate was an optical grade PET film obtained from Toray Industries (Toray Lumirror U46) coated with a primer consisting consisting of 0.28 wt % Poly[dimethylsiloxane-co-[3-(2-(2-hydroxyethoxy) ethoxy) propyl] methylsiloxane] (Aldrich Cat. No. 480320) and 0.60 wt % Synperonic NP30 (Fluka Cat. No 86209) in acetone solution. The material was mixed by shaking by hand. Approximately 3 ml of material was deposited across one edge of a 8.5"×11" sample of the substrate material, and drawn down across the film using a wire wrapped rod to generate a nominally 12 micron thick (wet) coating. The sample was allowed to dry in room temperature and room humidity conditions for approximately 1 minute. The TCC layer had an average cell size of 202 µm It was used to assemble an EL device with the same general structure as in Example 1, the brightness was 20.3% relative to the ITO control. This is significantly less that the brightness of the device in Example 1. The smaller average cell size of Example 1 is approximately the same size as the phosphor particles, whereas the larger cell size of this example is >4× that of the average phosphor size.

Example 3

EL Device with ATO Filler Material

The TCC coating and substrate used in Example 2 was used to assemble another flexible EL device in which ATO paste (AT 80-01 Clear conductive paste, Mobichem, Israel) was coated to a wet thickness of 25-30 µm on top of the TCC coating. The light-transmitting cells were thereby filled with ATO. After drying, a phosphor layer was placed, followed by a dielectric layer and counter electrode. The resulting EL device is represented schematically in FIG. 4.

When connected to a 100V AC 400 Hz power source, the device was illuminated as shown in FIG. 6. TCC coated film properties and selected properties of the resulting EL device are given in Table 1 under Example 3. Average cell size of the TCC electrode layer was 202 µm and brightness of the device relative to the ITO control was 71.7%. This value of brightness is an improvement relative to the samples of both Example 1 and Example 2.

Example 4

EL Device with ATO Filler Material (204 Microns Cell Size)

A transparent conductive coating material of the same formulation as in Example 2 was prepared on an optical grade PET substrate that was first treated with a primer as describe in Example 2. A flexible EL device was assembled with this coated film such that on top of the TCC coating side of the film, ATO solution was coated to a wet thickness of 15-17 µm. The ATO material at least partially filled the light-transmitting cell areas of the TCC pattern. After drying, a phosphor layer was placed, followed by a dielectric layer and counter electrode. The resulting EL device is also represented schematically in FIG. 4.

When connected to a 100V AC 400 Hz power source, the device was illuminated as shown in FIG. 7. TCC coated film properties and selected properties of the resulting EL device are given in Table 1 under Example 4. Average cell size of the TCC electrode layer was 204 µm and brightness of the device relative to the ITO control was 87.7%. This value of brightness is an improvement relative to the samples of Examples 1, 2, and 3.

Example 5

EL Device with PEDOT:PSS Filler Material (56 Microns Cell Size)

The following emulsion formulation

| Material | weight percent |
|---|---|
| Byk 410 | 0.15 |
| Disperyk 106 | 0.06 |
| Span 60 | 0.18 |
| sodium dodecyl sulfate | 0.02 |
| Aniline | 0.10 |
| 2-amino-1-butanol | 0.15 |
| Cymel 1168 | 0.20 |
| K-flex 148 | 0.13 |
| Nacure 2501 | 0.20 |
| Methylcyclohexane | 8.7 |
| Toluene | 52.0 |
| Cyclohexanone | 3.9 |
| Water | 16.1 |
| Baytron-P (PEDOT: PSS solution) | 16.1 |
| silver nanopowder (Cima NanoTech P204) | 2.1 |
| Total | 100% |

With the water, sodium dodecyl sulfate and the Baytron components in the water phase) was prepared and coated on a PET substrate (Skyrol SH34, SKC, Korea) to form a TCC electrode layer in a single step in which the light-transmitting cell areas contain PEDOT:PSS conductive polymer. A flexible EL device was then assembled such that on top of the TCC coating, a phosphor layer was placed, followed by a dielectric layer and a counter electrode. The resulting EL device is represented schematically in FIG. 4.

Figure 9:
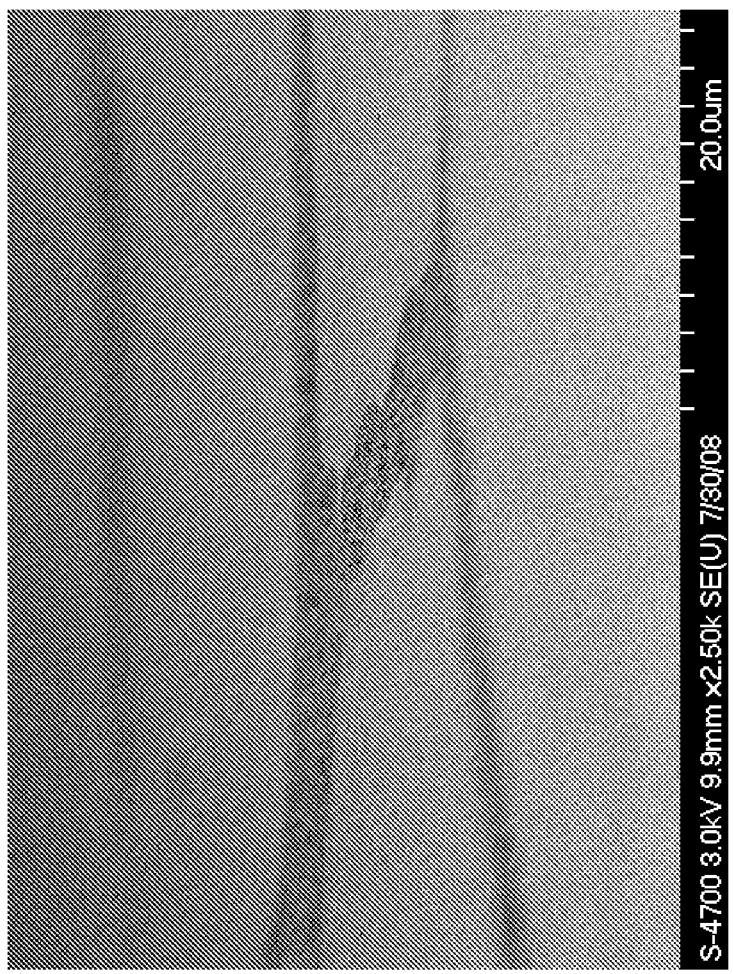
FIG. 9 is a scanned electron micrograph of a transparent conductive coating with adhesive filler after transfer to a second substrate with resultant flattened/smoothed surface visible here when the sample is imaged from an angle approached parallel to the plane of the sample.

When connected to a 100V AC 400 Hz power source, the device was illuminated as shown in FIG. 9. TCC coated film properties and selected properties of the resulting EL device are given in Table 1 under Example 5. Average cell size of the TCC electrode layer of this example was 56 µm, and brightness of the device was 62.6%, an improvement over Examples 1 and 2.

TABLE 1

Properties of TCC layers and EL devices of Examples 1-5.

| | TCC film properties | | | | | | | EL lamp properties | |
|---|---|---|---|---|---|---|---|---|---|
| | Avg. | Avg. | Avg. resistance | | Avg. | Line | Line | | |
| Example | Transmittance (%) | Haze (%) | ∥ Ohm/sq | = Ohm/sq | cell size µm | height µm | width µm | Brightness* % | Current I, Ma |
| Example 1 (TCC-F2-06) | 70.4 | 11.4 | 5.0 | 5.0 | 41 | 1.4 | 7.4 | 41.3 | 1.11 |
| Example 2 (TCC-F3-02) | 84.6 | 3.4 | 3.2 | 3.2 | 202 | 4.5 | 18.3 | 20.3 | 0.63 |

TABLE 1-continued

Properties of TCC layers and EL devices of Examples 1-5.

| | TCC film properties | | | | | | | EL lamp properties | |
|---|---|---|---|---|---|---|---|---|---|
| Example | Avg. Transmittance (%) | Avg. Haze (%) | Avg. resistance II Ohm/sq | = Ohm/sq | Avg. cell size μm | Line height μm | Line width μm | Brightness* % | Current I, Ma |
| With ATO deposition from solution, 25-30 micron wet thickness: | | | | | | | | | |
| Example 3 (TCC-F3-02) | 84.6 | 3.4 | 3.2 | 3.2 | 202 | 4.5 | 18.3 | 71.1 | 1.85 |
| With ATO deposition from solution, 15-17 micron wet thickness: | | | | | | | | | |
| Example 4 (TCC-F3-02) | 84.5 | 3.0 | 3.5 | 3.4 | 204 | ND | 17.1 | 87.7 | ND |
| With PEDOT: PSS in cell area: | | | | | | | | | |
| Example 5 | 75.3 | 5.8 | ND | 50.0 | 56 | ND | 13.6 | 62.6 | 1.32 |

*All brightness levels reported are relative to an 80 ohm/sq ITO control sample (Cat.# TMOx-80-ST504-7, SKC, Korea).
ND = not determined Example 6

Transfer Coating of TCC

A transparent conductive coating was prepared on one substrate, filled with an insulating/adhesive material, and transferred to another substrate, leaving a substantially flat exposed surface according to the following process.

A substrate of 4 mil thick polyethylene terepthalate (Toray Lumirror U46) was used.

On the substrate was deposited a layer of primer. The primer consisted of 0.28 wt % Poly[dimethylsiloxane-co-[3-(2-(2-hydroxyethoxy)ethoxy)propyl]methylsiloxane] (Aldrich Cat. No. 480320) and 0.60 wt % Synperonic NP30 (Fluka Cat. No 86209) in acetone solution. The material was mixed by shaking by hand. Approximately 3 ml of material was deposited across one edge of a 8.5"×11" sample of the substrate material, and drawn down across the film using a wire wrapped rod to generate a nominally 12 micron thick (wet) coating. The sample was allowed to dry in room temperature and room humidity conditions for approximately 1 minute.

An emulsion was prepared by thoroughly mixing the following materials with an ultrasonicating dispersing system.

| Component | % |
|---|---|
| Byk 410 | 0.282% |
| Span 60 | 0.161% |
| Cyclohexanone | 5.073% |
| Aniline | 0.093% |
| Toluene | 57.167% |
| Silver Nanoparticles (Cima NanoTech P204) | 4.025% |
| Water phase | 33.199% |
| Total | 100.000% |

The water phase system itself in the table above was comprised of a 0.02% solution (by weight) of BYK 348 in water.

Approximately 3 ml of material was deposited across one edge of a 8.5"×11" sample of substrate material that had been coated with primer as described above, and drawn down across the film using a wire wrapped rod to generate a nominally 30 micron thick (wet) coating. The sample was allowed to dry in room temperature and room humidity conditions for approximately 90 seconds. It was subsequently placed in an oven at 150° C. for 2 minutes.

At this stage, a transparent conductive film on a PET substrate was generated. Subsequent steps allow filling and transfer of the film.

A solution of LUV04 (Today's Suntech, Taiwan) (32.17% solids consist of acrylic monomer and photo initiator in Ethyl-Acetate—solution for making hard coating on PET) was applied onto a second substrate of U46 using Mayer rod #10. After solvents from this coating were dried in a laboratory hood, this coated substrate was heated at 150° C. for 30 sec.

The LUV04 coated substrate and transparent conductive mesh substrate were laminated together, using a Prolam Photo 6 Roller Laminator. The lamination conditions were: 130° C. and laminator speed 6. Laminated samples were subsequently cured under UV lamp of 254 nm wavelength for 5 min. After UV curing, films were manually stripped apart by hand. The transparent conductive coating was transferred onto the LUV04 coated substrate, with the cells of the pattern filled with the adhesive material. This transferred film had been placed under UV lamp again for additional 5 min to complete polymerization of LUV04 components. The samples were then immersed into 1M HCl solution for 1-2 min, washed by D.I. water and dried at 150° C. for 2 min. Sheet resistance of transferred samples was in the interval 4-10Ω/□. All samples showed no changes in the resistance after tape test and scratching by pen as well.

A scanned electron micrograph of the transparent conductive material with filler consisting of adhesive as transferred to a different substrate is present in FIG. 9.

What is claimed is:

1. A process of forming an article comprising:
   a. applying a liquid emulsion to the surface of a first substrate, wherein the liquid emulsion comprises (i) a discontinuous liquid phase and (ii) a continuous liquid phase that includes conductive nanoparticles and that evaporates more quickly than the discontinuous liquid phase;
   b. drying the emulsion and subsequently forming a transparent conductive coating comprising a network of traces formed of at least partially-joined nanoparticles defining randomly-shaped cells transparent to light; and
   c. applying a transparent filler material to at least partially fill at least some of the cells of the coating.

2. The process of claim 1 wherein the filler material is an adhesive.

3. The process of claim 2 further comprising the step of adhering a second substrate to the side of the article opposite the first substrate in contact with the adhesive.

4. The process of claim 3 further comprising the step of removing the first substrate from the article.

5. The process of claim 1 wherein the transparent filler material is an adhesive, the process comprising:
   i. providing a second substrate having a surface coated with the adhesive;
   ii. contacting the adhesive-coated surface of the second substrate with the transparent conductive coating to form a laminate; and
   iii. removing the first substrate to at least partially fill at least some of the cells of the transparent coating with the adhesive.

6. The process of claim 1 wherein the filler material is conductive.

7. The process of claim 1 wherein the filler material is abrasion-resistant, scratch-resistant, moisture-resistant, or any combination thereof.

* * * * *